United States Patent
Ohue et al.

[11] Patent Number: 5,950,077
[45] Date of Patent: *Sep. 7, 1999

[54] SEMICONDUCTOR DEVICE AND MANUFACTURING METHOD THEREOF

[75] Inventors: Makoto Ohue, Ikoma; Shinji Shimada, Kashihara, both of Japan

[73] Assignee: Sharp Kabushiki Kaisha, Osaka, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/910,138

[22] Filed: Aug. 13, 1997

[30] Foreign Application Priority Data

Sep. 2, 1996 [JP] Japan .................................. 8-232351

[51] Int. Cl.$^6$ .................................. H01L 21/322
[52] U.S. Cl. .................................. 438/149; 148/DIG. 60; 438/151; 438/471
[58] Field of Search .................................. 438/149, 151, 438/562, 780, 781, 795, FOR 155, FOR 184, FOR 201, FOR 323, FOR 390, 471, 476, 487; 148/DIG. 60

[56] References Cited

U.S. PATENT DOCUMENTS 5,462,886 10/1995 Sakai et al. .
5,529,937 6/1996 Zhang et al. ..................... 148/DIG. 60
5,578,697 11/1996 Kawamonzen et al. .

FOREIGN PATENT DOCUMENTS 3-280435 12/1991 Japan .
4-112050 4/1992 Japan .
4-57098 9/1992 Japan .

*Primary Examiner*—Charles Bowers
*Assistant Examiner*—David S Blum
*Attorney, Agent, or Firm*—Nixon & Vanderhye P.C.

[57] ABSTRACT

A semiconductor device in accordance with the present invention, for example, is a thin film transistor provided on a transparent substrate. The semiconductor device made of a polysilicon film is provided with (1) a semiconductor layer having a source region and a drain region and (2) a gate electrode provided on a region between the source region and the drain region of the semiconductor layer via a gate insulating film. The semiconductor device is further provided with an organic insulating film made of a condensation polymer having an imide ring such that the organic insulating film covers the gate electrode, the source region, and the drain region. The organic insulating film is formed by applying an organic insulating material such as polyimide, polyamic acid, and other materials, and thereafter by carrying out a calcining process, thereby reducing a trap density of the polysilicon film constituting the semiconductor layer without lowering the productivity due to low throughput, and realizing a semiconductor device which can be suitably adopted as a thin film transistor constituting a matrix circuit section of an active-matrix type liquid crystal display device.

21 Claims, 3 Drawing Sheets

SEMICONDUCTOR DEVICE AND MANUFACTURING METHOD THEREOF

FIELD OF THE INVENTION

The present invention relates to a semiconductor device and a manufacturing method thereof, and more particularly relates to a semiconductor device, provided on a transparent insulating substrate such as glass, which is suitably adopted as a thin film transistor for use in an active-matrix type liquid crystal display device, and a method for manufacturing such a semiconductor device.

BACKGROUND OF THE INVENTION

In an MOS (metal oxide semiconductor) type thin film transistor (referred to as MOS-TFT hereinafter), the effective mobility $\mu$ of a carrier can be increased if an active layer made of a polysilicon film is adopted, compared with the case of adopting an active layer made of an amorphous silicon film. Also, the active layer made of a polysilicon film allows the use of a high-temperature heating process in manufacturing the MOS-TFT.

However, in the case of adopting the active layer made of a polysilicon film, because a large number of traps exist in the polysilicon film, there arises such drawbacks that the threshold voltage $V_T$ of the MOS-TFT and a gate voltage for operating the MOS-TFT increase.

As a countermeasure, in order to reduce the trap density of the polysilicon film, the following method is adopted.

First, MOS-TFT is formed. Secondly, a plasma silicon nitride film containing hydrogen is formed by the plasma chemical vapor deposition (CVD) method. Finally, the plasma silicon nitride film is annealed (see Japanese Examined Patent Publication No. 57098/1992 (Tokukohei 4-57098)). FIG. 3(a) and FIG. 3(b) illustrate an example of a structure of a semiconductor device disclosed in the above publication. Here, the semiconductor device is employed in an active-matrix type liquid crystal display device. FIG. 3(a) is a plan view showing a thin film transistor (TFT) portion constituting a matrix circuit section of the liquid crystal display device, and FIG. 3(b) is a cross sectional view showing the structure of the thin film transistor (TFT) portion taken along a line C-C' in FIG. 3(a) As shown in FIG. 3(a) and FIG. 3(b), the matrix circuit section of the liquid crystal display device is composed of the TFT 300. On a glass substrate 301 constituting the liquid crystal display device, a light-shielding film 302 is provided so as to correspond to each TFT 300. An insulating film 303 is provided on each light-shielding film 302 so as to cover the light-shielding film 302. A portion on the insulating film 303 where TFT 300 is provided is provided with a semiconductor layer 304 constituting the TFT. The semiconductor layer 304 is composed of a channel region 304a, a source region 304$b_1$, and a drain region 304$b_2$.

On the semiconductor layer 304, a gate insulating film 305 made of $SiO_2$ or other materials is provided so as to cover the semiconductor layer 304. On the gate insulating film 305, a gate electrode 306 is provided so as to face the channel region 304a. The surface of the gate electrode 306 is covered with an anodic oxidation film 307. Further, on the gate electrode 306, an interlayer insulating film 308 is provided so as to cover the entire surface of the gate electrode 306. On portions of the interlayer insulating film 308 corresponding to the source region 304$b_1$ and the drain region 304$b_2$, a source electrode 309 and a drain electrode 310 are provided respectively. The source electrode 309 and the drain electrode 310 are electrically connected respectively to the source region $b_1$ and the drain region $b_2$ via contact halls 313. Further, the drain electrode 310 is electrically connected to a transparent pixel electrode 311 provided on the interlayer insulating film 308.

The entire surface of the TFT 300 formed in the described manner is covered with a $SiN_X$ film (passivation film) 312 which has been formed by a plasma CVD device. The $SiN_X$ film 312 is obtained by the steps: providing a plasma silicon nitride film containing hydrogen; and annealing the plasma silicon nitride film. The hydrogen atoms contained in the plasma silicon nitride film move into the polysilicon film and adhere to the traps that exist in the polysilicon film, thereby reducing the trap density of the polysilicon film forming the semiconductor layer 104 which constitutes the TFT 300.

However, because the $SiN_X$ film 312 formed by the plasma CVD method has low throughput and low productivity, the cost of manufacturing the $SiN_X$ film 312 becomes high if the $SiN_X$ film 312 is to be provided on the entire surface of the TFT 300. In other words, in order to reduce the manufacturing cost, it is required to cut down the number of manufacturing steps. Hence, it is difficult to reduce the manufacturing cost if the above-noted $SiN_X$ film 312 is to be provided.

SUMMARY OF THE INVENTION

The present invention offers a solution to the above mentioned problems, and accordingly it is an object of the present invention to provide a semiconductor device (1) which has improved throughput so as to reduce the manufacturing cost of the semiconductor device, (2) which has a sufficiently low threshold voltage $V_T$ and a gate voltage required for operating the semiconductor device and an extremely high effective mobility $\mu$ so as to be suitably adopted in an active-matrix type liquid crystal display device, and to provide the manufacturing method thereof.

In order to achieve the above-mentioned objects, a semiconductor device of the present invention is provided with a semiconductor layer made of a polysilicon film having a source region and a drain region, a gate electrode provided on a region between the source region and the drain region of the semiconductor layer via a gate insulating layer, and an insulating layer provided so as to respectively cover the gate electrode, the source region, and the drain region, wherein the insulating film is an organic insulating film made of a polymer having an imide ring.

According to this arrangement, as the insulating film covering the surface of the semiconductor layer such as an active layer of TFT provided on a transparent substrate, it is possible to adopt an organic insulating film made of a polymer having an imide ring. Thus, if the organic insulating film is prepared by applying a solution of a polymer having an imide ring or a solution of its precursor, and thereafter by carrying out a calcining process, the polysilicon film can be hydrogenated with ease in the calcining process due to the fact that the hydrogen atoms generated by a condensation reaction diffuse into the polysilicon film, and the dangling bonds of silicon atoms bound to the hydrogen atoms thus diffused. The silicon atoms having the dangling bonds exist in a grain boundary and a thin film interface.

Thus, it is possible to (1) reduce the trap (defect) density of the polysilicon film, (2) sufficiently lower the threshold voltage $V_T$ of the semiconductor device and the gate voltage which is required for operating the semiconductor device, and (3) greatly increase the effective mobility $\mu$ of the semiconductor device. Furthermore, the semiconductor device having the described arrangement can be adopted in an active-matrix type liquid crystal display device, thereby realizing a semiconductor device having an excellent displaying quality.

Moreover, compared with the $SiN_X$ film (passivation film) formed by a plasma CVD device or other devices, the organic insulating film made of a polymer having an imide ring has higher productivity, thereby permitting a reduction of the number of manufacturing steps. Hence, with the described arrangement, compared with a conventional arrangement in which the $SiN_X$ film is provided on the semiconductor device, the throughput can be improved, and the manufacturing cost can be reduced.

It is preferable that the semiconductor device of the present invention further includes a silicon nitride film provided between (1) the gate electrode, the source region, and the drain region and (2) the organic insulating layer.

The silicon nitride film is provided as an underlying layer of the organic insulating film made of a polymer having an imide ring so as to prevent the semiconductor layer from being affected by the solvent of a solution of the polymer having an imide ring or a solution of its precursor (for example, polyamic acid). The solution is applied when forming the organic insulating layer.

Note that, it is preferable that the silicon nitride film is prepared by the chemical vapor deposition method.

In order to achieve the above-mentioned objects, a method for manufacturing a semiconductor device in accordance with the present invention is characterized by including the steps of forming a semiconductor layer made of a polysilicon film, forming a gate electrode on the semiconductor device via a gate insulating film, forming a source region and a drain region on both sides of the gate electrode, and forming an insulating layer so as to respectively cover the gate electrode, the source region, and the drain region, wherein the insulating layer is an organic insulating film made of a polymer having an imide ring.

According to this method, the organic insulating film is formed by applying a solution of a polymer having an imide ring or a solution of its precursor, and thereafter by carrying out a calcining process. Thus, the polysilicon film can be hydrogenated with ease in the calcining process, thereby reducing the trap (defect) density of the polysilicon film, and realizing a semiconductor device whose threshold voltage $V_T$ and gate voltage are sufficiently low and whose effective mobility $\mu$ is remarkably high. The gate voltage is required for operating the semiconductor device.

Further, according to the described method, because it is not required to deposit the $SiN_X$ film having low throughput on the surface of a TFT, the number of manufacturing steps can be reduced, thereby reducing the manufacturing cost.

Thus, if a semiconductor device manufactured by the described method is employed in a liquid crystal display device such as an active-matrix liquid crystal display device, it is possible to provide a liquid crystal display device having an excellent displaying quality with good yield at a low cost without increasing the number of manufacturing steps.

In the manufacturing method of the semiconductor device of the present invention, it is preferable that the step of forming the organic insulating layer includes (1) a step of forming a resin film containing polyamic acid and (2) a step of imidating the polyamic acid composing the resin film by heating.

According to this method, the resin film containing polyamic acid is formed on a base material, and thereafter the resin film containing the polyamic acid is iminated by heating, thereby increasing the number of hydrogen atoms diffusing into the polysilicon film. This allows the hydrogenation of the polysilicon film with more ease. Further, since the resin film containing polyamic acid is heated, the solvent, if present, in the resin film can be evaporated simultaneously with the imination of the polyamic acid.

It is also preferable that the step of forming the organic insulating layer includes the steps of (1) a step of forming a resin film containing polyamic acid or polyimide and (2) a step of calcining the resin film.

Note that, it is preferable that the calcining temperature in the calcining process is in a range of 250° C. to 450° C. This permits efficient hydrogenation of the polysilicon film constituting the semiconductor layer, and suppresses the adverse effect of heat on the semiconductor device in the calcining process.

Further, in the calcining process, it is preferable that the resin film is baked in an atmosphere of hydrogen. This permits more efficient hydrogenation of the polysilicon film constituting the semiconductor layer.

Furthermore, in the calcining process, it is preferable that the resin film is baked while being irradiated by light having a wavelength of not more than 200 nm. According to this method, the resin film is irradiated by light having a wavelength of not more than 200 nm, thereby permitting even more efficient hydrogenation of the polysilicon film constituting the semiconductor layer.

For a fuller understanding of the nature and advantages of the invention, reference should be made to the ensuing detailed description taken in conjunction with the accompanying drawings.

BRIEF DESCRIPTION OF THE DRAWINGS

FIG. 1(a) is a plan view showing the TFT; and FIG. 1(b) is a cross sectional view showing a cross section of the TFT taken along a line A-A' in FIG. 1(a).

FIG. 3(a) is a plan view showing the TFT; and FIG. 3(b) is a cross sectional view showing a cross section of the TFT taken along a line A-A' in FIG. 3(a).

DESCRIPTION OF THE EMBODIMENTS

Figure 1A:
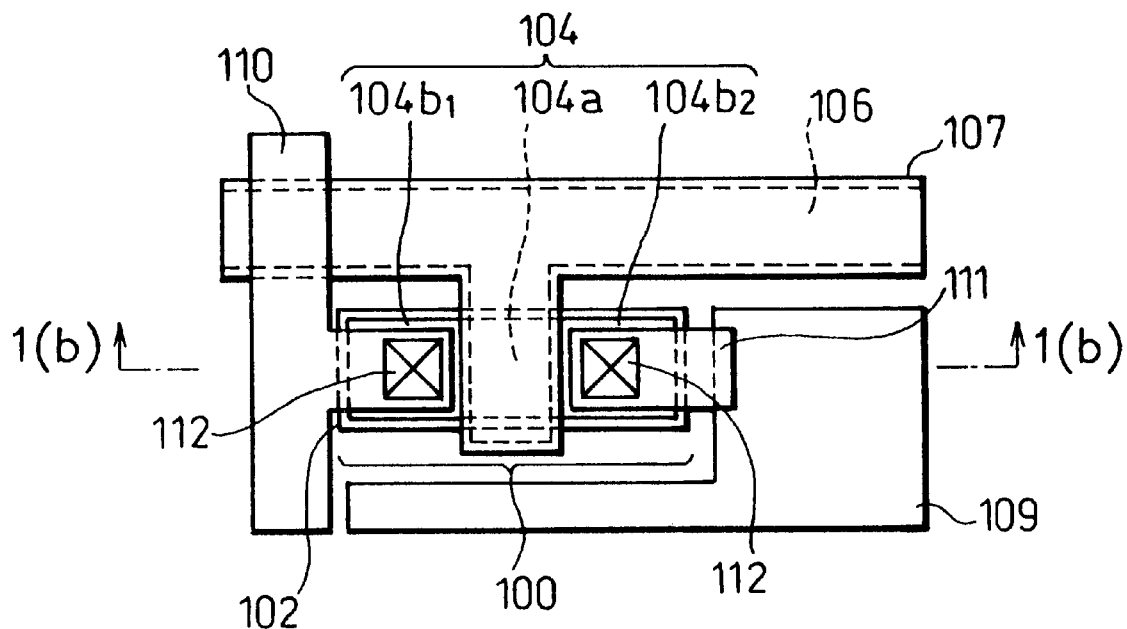
FIG. 1(a) and FIG. 1(b) are explanatory drawings showing TFT constituting an active-matrix type liquid crystal display device in accordance with one embodiment of a semiconductor device of the present invention.

First, the basic principle of the present invention will be explained.

A semiconductor device of the present invention is provided with (1) a semiconductor layer made of a polysilicon film which is composed of a channel region, a source region, and a drain region, (2) a gate electrode provided on the channel region via a gate insulating film, and (3) an insulating film provided on the semiconductor layer, wherein an organic insulating film made of a condensation polymer having an imide ring is provided so as to cover the gate electrode, the source region, and the drain region, respectively. Note that, the imide ring has a ring structure in which two carbonyl groups of the imide bond are linked by a carbon chain.

As a condensation polymer having an imide ring, although it is not limited to a specified one, dehydration condensation-type polyimide is particularly suitable. The dehydration condensation-type polyimide can be produced from a dehydration condensation polymerization reaction of tetracarboxylic acid with diamine.

It is preferable to prepare the organic insulating film made of the dehydration condensation-type polyimide by either of the following two methods: (1) applying a solution of the dehydration condensation-type polyimide to a material, and thereafter calcining the material thus applied with the dehydration condensation-type polyimide so as to remove the solvent; (2) applying polyamic acid, which is a precursor of the dehydration condensation-type polyimide, to a material, and thereafter (3) calcining the material thus applied with the polyamic acid so as to remove the solvent, and (4) imidating the polyamic acid so as to be converted to the dehydration condensation-type polyimide.

The polyamic acid is a condensation polymer represented by the general formula:

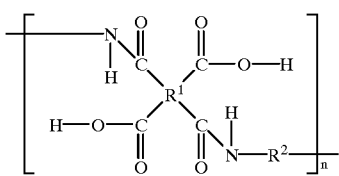

which can be produced by a dehydration condensation reaction of carboxylic tetraanhydride (for example, pyromellitic anhydride) represented by the general formula:

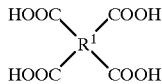

with diamine (for example, diamine diphynyl ether) represented by the general formula:

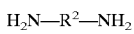

where $R^1$ and $R^2$ in the above formulas respectively represent a tetravalent hydrocarbon group and a divalent hydrocarbon group that may contain an ether bond. Also, the polyamic acid is an intermediate that can be converted to the dehydration condensation-type polyimide by an intramolecular dehydration condensation reaction.

In short, the organic insulating film is prepared by the spin coating method in which the solution of the dehydration condensation-type polyimide or the solution of polyamic acid is applied to a material, and thereafter the material thus prepared is baked.

The trap density of the polysilicon film can be reduced effectively if the calcining process is carried out in an atmosphere of hydrogen.

(1) The carboxyl groups of the dehydration condensation-type polyimide or the polyamic acid and (2) the hydrogen atoms of the amide bond of the dehydration condensation-type polyimide or the polyamic acid can be transferred to the polysilicon film more efficiently if (a) the calcining process is carried out at a temperature in a range of 250° C. to 450° C., preferably at a temperature in a vicinity of 300° C., or (b) the calcining process is carried out while irradiating UV light ($\lambda \leq 200$ nm) on the solution of the dehydration condensation-type polyimide or the polyamic acid (resin film) which have been applied on the material. Therefore, by adopting one of the calcining processes described above, the trap density of the polysilicon film can be reduced more effectively.

Also, the calcining process simultaneously activates the source region and the drain region of the semiconductor layer made of the polysilicon film.

Thus, according to the manufacturing method of the present invention, it is possible to obtain TFT whose threshold voltage and gate voltage are sufficiently low and whose effective mobility $\mu$ is remarkably high. The gate voltage is required for operating the semiconductor device. Such TFT can be employed in an active-matrix type liquid crystal display device.

Figure 1B:
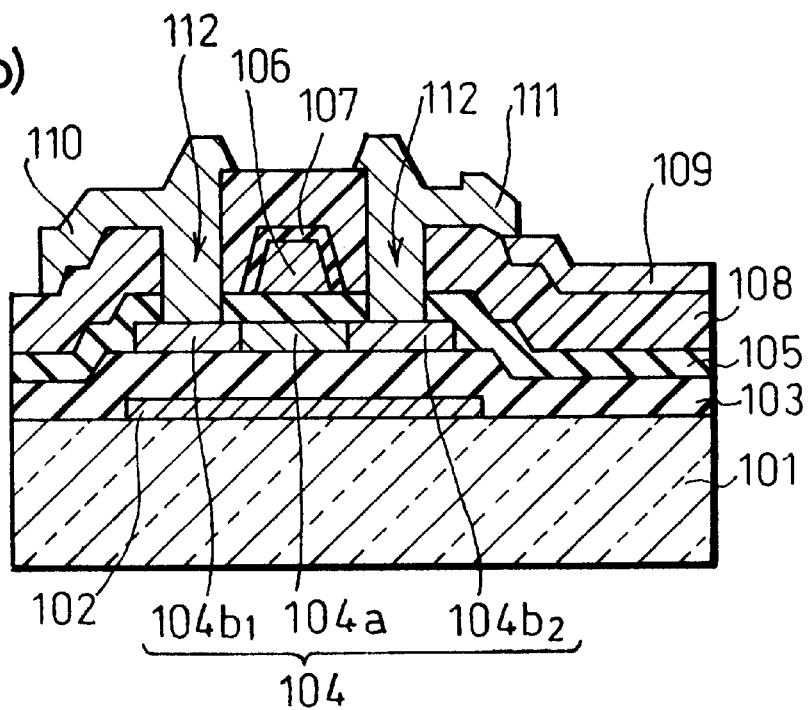

The following will explain the TFT constituting the matrix circuit section in accordance with one embodiment of the semiconductor device of the present invention referring to FIG. 1. The matrix circuit section is a driving circuit of a liquid crystal display element in the active-matrix type liquid crystal display device. Note that, the present invention is not limited to the following embodiment.

The active-matrix type liquid crystal display device is provided with a plurality of TFT 100 (semiconductor device) constituting the matrix circuit section in accordance with the present invention, as shown in FIG. 1. On a transparent substrate 101 made of glass or other materials, constituting the liquid crystal display device, a light-shielding film 102 made of a refractory metal such as Ta and Nb is provided so that the light-shielding film 102 corresponds to the TFT 100. On the light-shielding film 102, an insulating film 103 is provided so as to cover the light-shielding film 102. The insulating film 103 is made of an insulating material such as silicon dioxide ($SiO_2$) and silicon nitride ($SiN_x$).

A portion on the insulating film 103 where the TFT is provided, a semiconductor layer 104 made of a polysilicon constituting the TFT 100 is provided. The semiconductor layer 104 is composed of a source region 104$b_1$ and a drain region 104$b_2$ which are doped with n-type impurity such as $P^+$ (ion doping). A portion of the semiconductor layer between the source region 104$b_1$ and the drain region 104$b_2$ which is not doped with the n-type impurity constitutes a channel region 104a.

On the semiconductor layer 104, a gate insulating film 105 made of $SiO_2$, $SiN_x$, and other materials is provided so as to cover the semiconductor layer 104. On the gate insulating substrate 105, a gate electrode 106 is provided so as to face the channel region 104a. The gate electrode 106 is a film made of a metal having low resistance such as Al and an Al alloy which is coated with an anodic oxidation film 107.

Further, an interlayer insulating film (insulating film) 108 is provided on the entire surfaces of the gate insulating film 105, the gate electrode 106, and the anodic oxidation film 107 so as to cover the gate electrode 106. The interlayer insulating film 108 is an organic insulating film made of a condensation polymer having an imide ring. The interlayer insulating film 108 is prepared by (1) applying a solution of an organic insulating material such as the dehydration condensation-type polyimide and polyamic acid to a base material, and thereafter (2) calcining the base material thus prepared so as to evaporate the solvent.

Furthermore, on portions of the interlayer insulating film 108 corresponding to the source region 104$b_1$ and the drain region 104$b_2$, a source electrode 110 and a drain electrode 111 are provided respectively. The source electrode 110 and the drain electrode 111 are electrically connected respectively to the source region 104$b_1$ and the drain region 104$b_2$ via contact halls 112 which penetrate through the gate insulating film 106 and the interlayer insulating film 108. Also, a transparent pixel electrode 109 provided on the interlayer insulating film 108 is electrically connected to the drain electrode 111.

Here, a method for manufacturing the TFT (semiconductor device) will be explained.

FIG. 2 is an explanatory drawing showing the manufacturing method of the TFT (semiconductor device). FIG. 2(a) through FIG. 2(e) are cross sectional views showing structures in the main steps of the manufacturing method of the TFT.

A metal film, having a thickness of substantially 100 nm, is deposited by the sputtering method or other methods on the transparent substrate 101 made of an insulator such as a glass substrate. Here, a film made of a refractory metal such as Ta and Nb is formed. Thereafter, the refractory metal film thus formed is selectively etched by the photolithography method so that the light-shielding film 102 having a target plan pattern is provided on a predetermined region on the surface of the transparent substrate 101.

The insulating film 103 made of $SiO_2$, $SiN_X$, and other compounds is deposited on the entire surface of the substrate by the sputtering method or the plasma CVD method so as to cover the light-shielding film 102. Namely, the insulating film 103 is deposited on the surface of the transparent substrate 101 and the light-shielding substrate 102. The insulating film 103 is deposited so as to have a film thickness of substantially 300 nm (see FIG. 2(a)).

An amorphous silicon film is deposited on the insulating film 103 by the CVD method or other methods so as to have a film thickness of 10 nm to 200 nm, preferably in a film thickness of 30 nm to 100 nm. Thereafter, the amorphous silicon film is heated so that the amorphous silicon film acquires a crystalline property, thereby converting the amorphous silicon film to the polysilicon film.

As a method of the heating process, either one of the following two methods may be adopted: (1) calcining the entire substrate (transparent substrate 101, light-shielding film 102, insulating film 103, and amorphous silicon film) at a temperature of substantially 600° C. or (2) irradiating high energy light such as light emitted from an excimer laser on the amorphous silicon film.

Figure 2A:
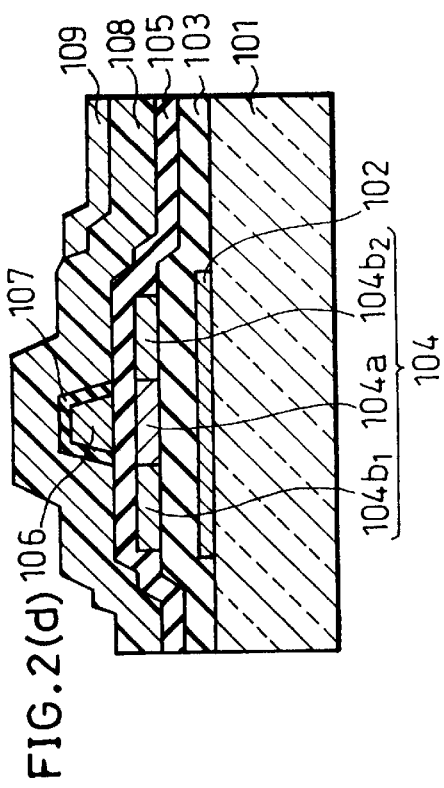
FIG. 2(a) through FIG. 2(e) are cross sectional views showing main manufacturing steps of the TFT portion in the order to be processed.
Figure 2B:
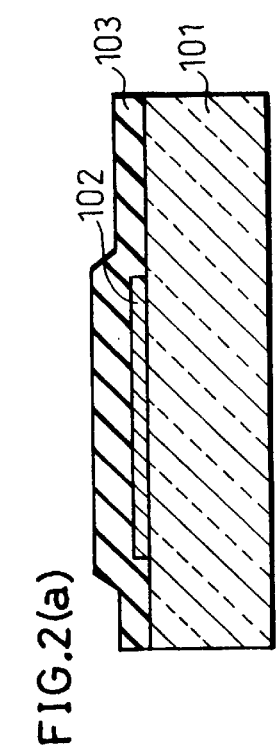

The polysilicon film is selectively etched by the photolithography method so as to form the semiconductor layer 104 on a portion of the insulating film 103 surface corresponding to the light-shielding film 102 (see FIG. 2(b)). Thereafter, by using photosensitive resin as a mask, n-type impurity such as $P^+$ is implanted into a target portion of the semiconductor layer 104 from above the substrate.

Note that, in the case of using the gate insulating film 105 as auxiliary capacity, the n-type impurity is implanted not only into the target portion of the semiconductor layer 104 but also into a portion of the semiconductor layer 104 underlying the portion of the gate insulating film 105 to be auxiliary capacity. The gate insulating film 105 is provided between the gate electrode 106 and the semiconductor layer 104.

The insulating film 105 made of $SiO_2$, $SiN_X$, and other compounds is deposited on the entire surface of the substrate by the sputtering method or the plasma CVD method so as to cover the semiconductor layer 104 with a film thickness of substantially 100 nm (see FIG. 2(b)). Namely, the insulating film 105 is deposited on the insulating film 103 and the semiconductor layer 104.

A metal film is deposited on the gate insulating film 105 by the sputtering method or other methods so as to form a metal film having a thickness of around 350 nm. Here, a metal film made of a metal having low resistance such as Al or an Al alloy is adopted. Thereafter, the metal film having low resistance thus formed is selectively etched by the photolithography method so that the gate electrode 106 having a predetermined pattern is provided on the gate insulating film 105.

Figure 2C:
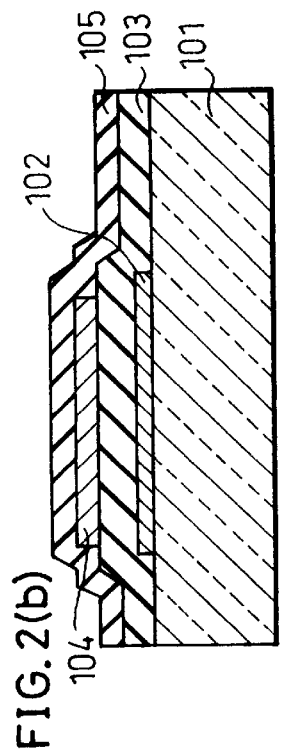
Figure 2D:
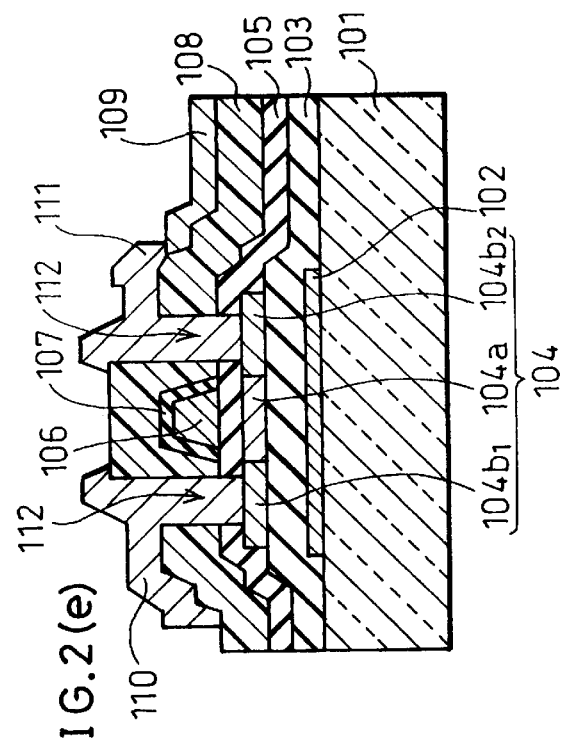
Figure 2E:
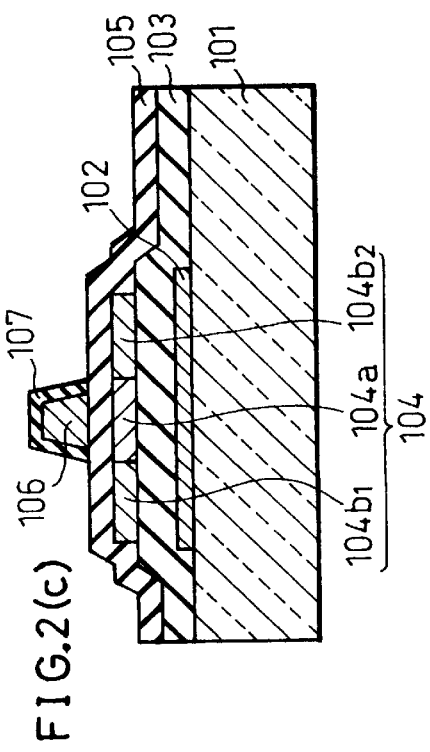
Figure 3A:
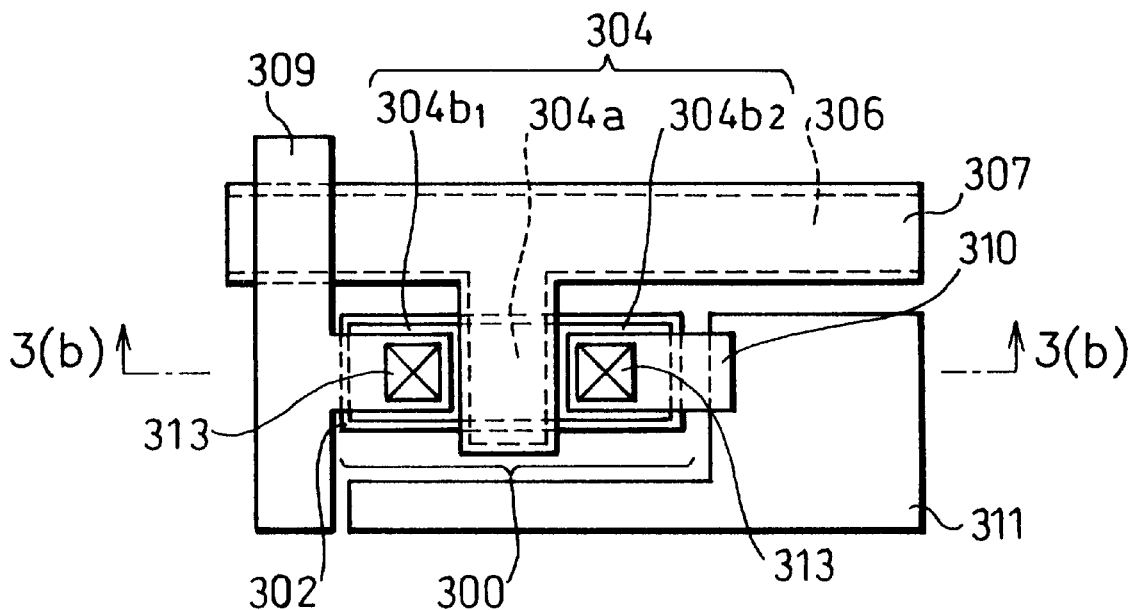
FIG. 3(a) and FIG. 3(b) are explanatory drawings showing TFT constituting an active-matrix type liquid crystal display device in accordance with one embodiment of a semiconductor device of the present invention.
Figure 3B:
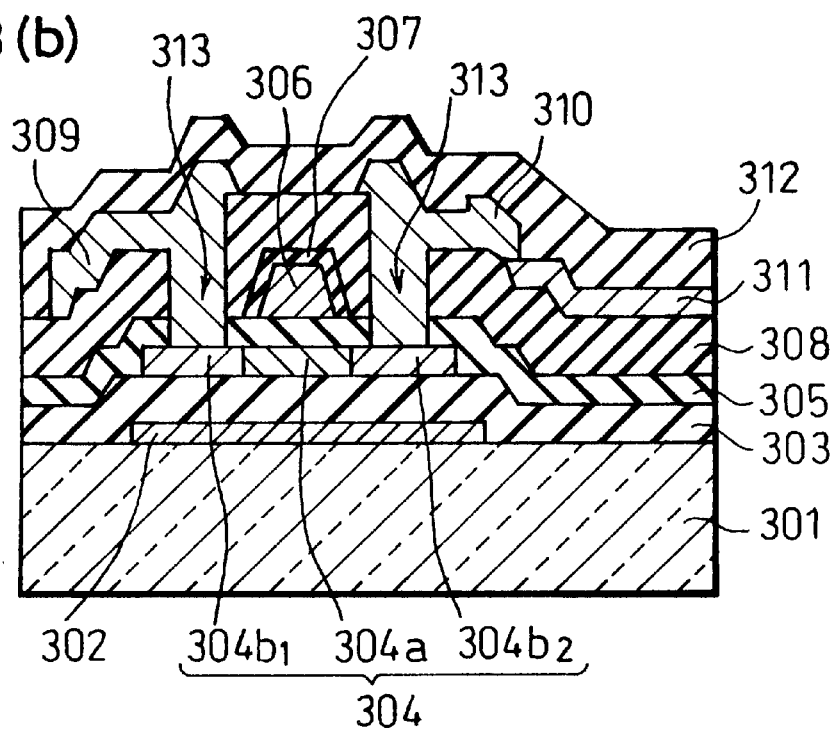

An anodic oxidation process is carried out to the gate electrode 106 so as to form the anodic oxidation film 107 on the surface of the gate electrode 106 (see FIG. 2(c)). In the anodic oxidation process, for example, the entire substrate is soaked in an anodic oxidation solution (electlyte) such as an aqueous solution of tartaric acid, and a formation voltage of substantially 100 V is applied to the plus and minus terminals of a constant electric current source which are connected respectively to the gate electrode 106 and a counter electrode, thereby forming the anodic oxidation film 107 having a film thickness of around 140 nm on the surface of the gate electrode 106. The anodic oxidation film 107 causes to create an offset region, i.e., a spacer between (1) the gate electrode 106 and (2) the source region $104b_1$ and the drain region $104b_2$, the anodic oxidation film 107 also prevents the occurrence of hillock on the gate electrode 106 made of Al or an Al alloy.

The hillock refers to a micro projection which is generated as Al atoms move along grain boundary and diffuse. The Al atoms are forced to move by a compressive stress generated due to a difference in coefficients of thermal expansion of (1) a glass substrate etc. constituting the transparent substrate 101 and (2) a thin film made of Al or an Al alloy constituting the gate electrode 106.

Photosensitive resin such as a photoresist is formed so as to cover the entire surface of the substrate. Namely, the photosensitive resin covers the surfaces of the gate insulating film 105, the gate electrode 106, and the anodic oxidation film 107, respectively. Thereafter, a portion of the photosensitive resin corresponding to the semiconductor layer 104 is removed. Then, the n-type impurity such as $P^+$ is implanted into the semiconductor layer 104 by the ion doping method from above the substrate. Here, as a mask, the photosensitive resin, the gate electrode 106, and the anodic oxidation film 107 are used. Note that, the impurity may be implanted in such a manner that either one of a p-type region and an n-type region is formed as the source region $104b_1$ and the drain region $104b_2$.

After removing the photosensitive resin, the impurity implanted in the described manner is activated by heating so as to form the source region $104b_1$ and the drain region $104b_2$ (see FIG. 2(c)). As a method of the heating process, one of the following two methods (1) and (2) may be adopted: (1) calcining the entire substrate at a temperature of substantially 600° C. or (2) irradiating high energy light such as light emitted from an excimer laser on the polysilicon film to which the impurity has been implanted.

The implantation and the activation of the impurity form the source region $104b_1$ and the drain region $104b_2$. A portion of the semiconductor layer 104 between the source region $104b_1$ and a drain region $104b_2$ to which no impurity is implanted constitutes a channel region 104a.

A solution such as a solution of dehydration condensation-type polyimide or a solution of polyamic acid, in which an organic insulating material made of a polymer diluted with a solvent, is applied by a spin coater so as to have a thickness of 400 nm to 2 μm and respectively cover the gate insulating film 105, the gate electrode 106, and the anodic oxidation film 107, thereby forming a resin film made of the polymer and the solvent. The polymer contains the amide bond and the carboxylic group which can undergo intramolecular dehydration condensation reaction each other. As the solvent, an amide solvent having a high dielectric constant such as N-methylpyrolidone is suitably adopted, because the organic insulating material is highly soluble in such a solvent.

Note that, the dehydration condensation-type polyimide contains the amide bond and the carboxylic group which can undergo intramolecular dehydration condensation reaction. This is because the dehydration condensation-type polyimide is not iminated completely.

The resin film is baked so as to evaporate the solvent contained in the resin film, thereby forming the organic insulating film made of a condensation polymer having an imide ring. Note that, in the case of adopting polyamic acid as the polymer, imidating of the polyamic acid is made during the calcining process.

It is preferable that the calcining temperature is in a range of 250° C. to 450° C., but the calcining temperature of 300° C. is most preferable. Also, it is preferable that the calcining process is to be carried out in an atmosphere of hydrogen. It is further preferable that the calcining process is to be carried out while irradiating UV light having a wavelength of not more than 200 nm (more preferably, 200 nm) on the organic insulating film.

In the calcining process, a hydrogen atom is produced as the amide bond and the carboxylic group of the polymer undergo an intramolecular dehydration condensation reaction. The hydrogen atom thus produced is utilized in the hydrogenation of the polysilicon film constituting the semiconductor layer 104, thereby reducing the trap density of the polysilicon film.

Note that, in order to prevent the semiconductor layer 104 from being affected by the solvent contained in the resin film, an insulating film (not shown) made of such as $SiO_2$ or $SiN_X$ may be formed beforehand by the sputtering method or the plasma CVD method.

A transparent conductive film made of such as ITO (indium tin oxide) film is deposited on the interlayer insulating film 108 by the sputtering method or other methods so as to have a thickness of substantially 100 nm. Thereafter, the transparent conductive film thus deposited is etched by the photolithography or other methods so that a pixel electrode 109 having a predetermined plan pattern is provided on the interlayer insulating film 108. (see FIG. 2(d)).

Contact holes 112 are formed, penetrating through portions of the interlayer insulating film 108 and the insulating film 105 corresponding to the source region $104b_1$ and the drain region $104b_2$, respectively. Thereafter, a metal film is deposited on the interlayer insulating film 108 by the sputtering method or other methods so as to have a thickness of substantially 500 nm. Here, a metal film made of a metal having low resistance such as Al or an Al alloy is adopted. The metal film is deposited such that the metal film partially fills the contact halls 112. Then, the metal film thus deposited is selectively etched by the photolithography method so as to form the source electrode 110 and the drain electrode 111, thereby completing the TFT (semiconductor device) 100 of FIG. 1 (see FIG. 2(e)).

As described, in the present embodiment, the interlayer insulating film 108 is an organic insulating film covering the surface of the TFT 100 which is provided on the transparent substrate 101. The organic insulating film is formed by applying an organic insulating material diluted with a solvent, and thereafter by carrying out the calcining process. The organic insulating material is made of a polymer having the amide bond and the carboxylic group which can undergo an intramolecular dehydration condensation reaction each other. Examples of such a polymer are dehydration condensation-type polyimide, polyamic acid, and other compounds. Therefore, in the process of calcining the organic insulating material, the polysilicon film constituting the semiconductor layer (active layer) 104 can be subjected to hydrogenation so as to reduce the trap density of the polysilicon film. Also, compared with the $SiN_X$ film formed by a plasma CVD device, the organic insulating film has higher productivity, thereby reducing the number of manufacturing steps, as well as the manufacturing cost.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method for manufacturing a semiconductor device, comprising the steps of:

forming a semiconductor layer made of a polysilicon film;

forming a silicon nitride gate insulating film on the semiconductor layer, wherein said silicon nitride gate insulating film forms a part of the semiconductor device final construction;

forming a gate electrode via the gate insulating film;

forming a source region and a drain region on both sides of the gate electrode;

forming an insulating layer so as to respectively cover the gate insulating film, the gate electrode, the source region and the drain region such that the silicon nitride gate insulating film is provided between (1) the gate electrode, the source region and the drain region and (2) the insulating layer, wherein the insulating layer is an organic insulating film made of a polymer having an imide ring, and wherein said step of forming an insulating layer includes the steps of:

forming a resin film containing polyamic acid or polyimide; and baking the resin film while irradiating with light having a wavelength of not more than 200 nm.

2. The method as set forth in claim 1, wherein said step of forming the organic insulating film includes the steps of:

forming a resin film containing a polymer having a carboxylic group and an amide linkage, the carboxylic group and the amide linkage being able to undergo an intramolecular dehydration condensation reaction with each other; and forming the imide ring by an intramolecular dehydration condensation reaction of the amide linkage with the carboxylic group.

3. The method as set forth in claim 2, wherein in said step of forming the imide ring, the resin film containing the polymer is heated.

4. The method as set forth in claim 1, wherein said step of forming the insulating layer includes the step of imidating the resin film containing polyamic acid by heating.

5. The method as set forth in claim 1, wherein said step of forming the insulating layer further includes the step of calcining the resin film.

6. The method as set forth in claim 5, wherein in the calcining step, the resin film is baked at a temperature in a range of 250° C. to 450° C.

7. The method as set forth in claim 5, wherein in the calcining step, the resin film is baked in an atmosphere of hydrogen.

8. The method as set forth in claim 5, wherein said step of baking the resin film while irradiating with light having a wavelength of not more than 200 nm is performed in the calcining step.

9. The method as set forth in claim 1, wherein in said step of forming the resin film, a solution of polyamic acid or a solution of polyimide is applied by a spin coating method.

10. A method for manufacturing a semiconductor device, comprising the steps of:

forming a semiconductor layer made of a polysilicon film;

forming a silicon nitride gate insulating film on the semiconductor layer, wherein said silicon nitride gate insulating film forms a part of the semiconductor device final construction;

forming a gate electrode via the gate insulating film;

forming a source region and a drain region on both sides of the gate electrode;

forming an insulating layer so as to respectively cover the gate insulating film, the gate electrode, the source region, and the drain region such that the silicon nitride gate insulating film is provided between (1) the gate electrode, the source region and the drain region and (2) the insulating layer, wherein the insulating layer is an organic insulating film made of a polymer having an imide ring, and wherein said step of forming an insulating layer includes the steps of:

forming a resin film containing polyamic acid; and baking the resin film in an atmosphere of hydrogen.

11. The method as set forth in claim 10, wherein said step of forming the organic insulating film includes the steps of:

forming the resin film containing a polymer having a carboxylic group and an amide linkage, the carboxylic group and the amide linkage being able to undergo an intramolecular dehydration condensation reaction each other; and forming the imide ring by an intramolecular dehydration condensation reaction of the amide linkage with the carboxylic group.

12. A method for manufacturing a semiconductor device, comprising the steps of:

forming a semiconductor layer made of a polysilicon film;

forming a silicon nitride gate insulating film on the semiconductor layer, wherein said silicon nitride gate insulating film forms a part of the semiconductor device final construction;

forming a gate electrode via the gate insulating film;

forming a source region and a drain region on both sides of the gate electrode;

forming an insulating layer so as to respectively cover the gate insulating film, the gate electrode, the source region, and the drain region such that the silicon nitride gate insulating film is provided between (1) the gate electrode, the source region and the drain region and (2) the insulating layer, wherein the insulating layer is an organic insulating film made of a polymer having an imide ring, and wherein said step of forming an insulating layer includes the steps of:

forming a resin film containing a polymer having a carboxylic group and an amide linkage, the carboxylic group and the amide linkage being able to undergo an intramolecular dehydration condensation reaction with each other; and forming the imide ring by an intramolecular dehydration condensation reaction of the amide linkage with the carboxylic group.

13. The method as set forth in claim 12, further comprises a step of baking the resin film includes the step of baking the resin film in an atmosphere of hydrogen.

14. The method as set forth in claim 12, wherein in said step of forming the imide ring, the resin film containing the polymer is heated.

15. The method as set forth in claim 12, wherein said step of forming the organic insulating film includes the step of imidating the resin film containing polyamic acid by heating.

16. The method as set forth in claim 12, wherein said step of forming the organic insulating film further includes the steps of:

forming a resin film containing polyamic acid or polyimide; and calcining the resin film.

17. The method as set forth in claim 16, wherein in the calcining step, the resin film is baked at a temperature in a range of 250° C. to 450° C.

18. The method as set forth in claim 16, wherein in the calcining step, the resin film is baked in an atmosphere of hydrogen.

19. The method as set forth in claim 16, wherein in the calcining step, the resin film is baked while being irradiated by light having a wavelength of not more than 200 nm.

20. The method as set forth in claim 12, wherein in said step of forming the resin film, a solution of polyamic acid or a solution of polyimide is applied by a spin coating method.

21. A method for manufacturing a semiconductor device, comprising the steps of:

forming a semiconductor layer made of a polysilicon film;

forming a silicon nitride gate insulating film on the semiconductor layer, wherein said silicon nitride gate insulating film forms a part of the semiconductor device final construction;

forming a gate electrode via the gate insulating film;

forming a source region and a drain region on both sides of the gate electrode;

forming an insulating layer so as to respectively cover the gate insulating film, the gate electrode, the source region, and the drain region such that the silicon nitride gate insulating film is provided between (1) the gate electrode, the source region and the drain region and (2) the insulating layer, wherein the insulating layer is an organic insulating film made of a polymer having an imide ring, and wherein said step of forming an insulating layer includes the steps of:

forming a polyimide film;

performing dehydration condensation of the polyimide film by baking; and using hydrogen produced by the dehydration condensation to perform hydrogenation of the polysilicon film making up the semiconductor layer.

* * * * *